US011177219B1

(12) United States Patent
Youn et al.

(10) Patent No.: US 11,177,219 B1
(45) Date of Patent: Nov. 16, 2021

(54) PHOTONIC INTEGRATED CIRCUIT WITH INTEGRATED OPTICAL TRANSCEIVER FRONT-END CIRCUITRY FOR PHOTONIC DEVICES AND METHODS OF FABRICATING THE SAME (71) Applicant: Hewlett Packard Enterprise Development LP, Houston, TX (US)

(72) Inventors: Jinsung Youn, Milpitas, CA (US); Mir Ashkan Seyedi, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/948,397

(22) Filed: Sep. 16, 2020

(51) Int. Cl.
*H01L 23/538* (2006.01)
*H04B 10/40* (2013.01)
*H04B 10/25* (2013.01)
*H04J 14/02* (2006.01)
*H01L 23/498* (2006.01)

(52) U.S. Cl.
CPC ......... *H01L 23/5384* (2013.01); *H04B 10/25* (2013.01); *H04B 10/40* (2013.01); *H01L 23/49827* (2013.01); *H04J 14/02* (2013.01)

(58) Field of Classification Search
CPC ..... H01B 10/25; H01B 10/40; H01L 23/5384; H01L 23/49827; H04J 14/02
USPC ....................................................... 398/116
See application file for complete search history.

(56) References Cited

U.S. PATENT DOCUMENTS

| | | | |
|---|---|---|---|
| 9,651,751 B1* | 5/2017 | Ding | H01S 5/02345 |
| 9,668,037 B2 | 5/2017 | Jones et al. | |
| 10,025,047 B1 | 7/2018 | Liu et al. | |
| 10,374,719 B2 | 8/2019 | Peterson et al. | |
| 2014/0321804 A1* | 10/2014 | Thacker | H01L 25/0655 385/14 |
| 2016/0142155 A1* | 5/2016 | Kim | H04B 10/40 398/141 |
| 2017/0047312 A1* | 2/2017 | Budd | H01L 25/117 |
| 2019/0033542 A1 | 1/2019 | Epitaux et al. | |
| 2020/0319416 A1* | 10/2020 | Patel | G02B 6/4271 |

OTHER PUBLICATIONS

Lin, S et al.; "High-density 3D Electronic-photonic Integration"; Oct. 2015; 2 pages.
Sirbu, B. et al.; "3D Silicon Photonics Interposer for Tb/s Optical Interconnects in Data Centers with Double-side Assembled Active Components and Integrated Optical and Electrical Through Silicon via on Soi"; May 2019; 9 pages.

* cited by examiner

*Primary Examiner* — Dalzid E Singh
(74) *Attorney, Agent, or Firm* — Hewlett Packard Enterprise Patent Department (57) ABSTRACT

Examples include a photonic device including a photonic integrated circuit (PIC), an optical transceiver (OTRx) front-end circuitry integrated with the PIC, an electronic integrated circuit (EIC) and an interposer. The PIC and the EIC are disposed on the interposer. The EIC is electrically interconnected to the OTRx front-end circuitry in the PIC. Some examples include a method of fabricating a photonic device.

18 Claims, 5 Drawing Sheets

PHOTONIC INTEGRATED CIRCUIT WITH INTEGRATED OPTICAL TRANSCEIVER FRONT-END CIRCUITRY FOR PHOTONIC DEVICES AND METHODS OF FABRICATING THE SAME

BACKGROUND

With the ever growing demand of the bandwidth in data processing and communication, data centers and high-performance computers have to continuously increase their capacities and performances. This enhancement in data processing performances should accompanied by a decrease in power consumption as well as manufacturing cost. Silicon photonics may be one of the most promising technologies that can address the growing demands of bandwidth at lower cost resulting from high bandwidth links, natural channel parallelization through wavelength division multiplexing (WDM), energy efficiency, marginal signal attenuation, and ability to leverage the existing Complementary Metal-Oxide-Semiconductor (CMOS) infrastructure.

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein.

Various elements and features in FIGS. 1 and 2 are not drawn to scale and are used for illustration purposes only. In fact, the dimensions of the various features may be arbitrarily increased or reduced for clarity of discussion.

DETAILED DESCRIPTION

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms ("a," "an," and "the" are intended to include the plural forms as well, unless the context clearly indicates otherwise. The term "plurality," as used herein, is defined as two as or more than two. The term "another," as used herein, is defined as at least a second or more. The term "and/or" as used herein refers to and encompasses any and all possible combinations of the associated listed items.

As discussed, silicon photonics can address the bandwidth demands for data centers and high performance computers. In this regard, integrating photonic integrated circuits (PICs) with electronic integrated circuits (EICs) and compute integrated circuits (e.g., application-specific integrated circuits (ASICs) and field programmable gate arrays (FPGAs)) is critical in developing photonic devices such as silicon photonic devices (e.g., silicon photonic transceivers), which is an integral part of the data centers and high performance computers. The integration architecture for silicon photonic transceivers may have major impact on its areal bandwidth, edge bandwidth, and packaging parasitic. These factors directly influence the device's bandwidth, energy consumption, and performance.

A PIC generally includes optoelectronic and optical devices to perform optical operations such as to convert optical signals to or from electrical signals as part of a fiber optic system. An EIC generally includes electronic devices and circuits to perform operations using electrical signals. In some examples, the EIC includes a plurality of transistors and circuits that form a unit of logic, cell, or chip layout design which is intellectually property (IP) of an entity and is often referred to as 'electronic IP.' There are various commercially available electronic IPs that support different protocols such as PCI-e, SATA, and USB, and digital signaling schemes such as NRZ, PAM4 to leverage them in different applications. An EIC is often interconnected with a PIC to deliver electrical signals to modulate optical signals, receive converted optical signals as electrical signals to analyze or pass to other circuits, or provide power to the PIC for the analysis or conversion of optical signals to or from electrical signals.

Various approaches for integrating an EIC and a PIC may include monolithic integration and hybrid integration such as 2D, 3D, and 2.5D. Monolithic integration is defined as when both an EIC and a PIC are fabricated on a single silicon substrate with the same fabrication process. This approach offers a minimum parasitic, as the PIC and the EIC can be tightly integrated with only microns of separation. However, developing a fabrication process that is simultaneously optimized for the PIC and the EIC may be a challenge.

In contrast to the monolithic integration, the hybrid integration involves separate fabrication processes for the EIC and the PIC. In the hybrid integration, the performance of the PIC and the EIC is generally much higher as compared to that of the monolithic integration because there can be high waveguide loss, low photodiode bandwidth and low cut-off frequency in the monolithic integration. In addition, the development costs for the monolithic integration can be much higher as compared to that of the hybrid integration. Out of various hybrid integration approaches (e.g., 2D, 3D and 2.5D hybrid integrations), the 2.5D hybrid integration can offer comparatively low parasitics, heterogeneous process optimization and high bandwidth to a compute IC. With the 2.5 hybrid integration, both the PIC and the EIC are flipped on an interposer (e.g., a silicon interposer). An interposer is a substrate that serves as an electrical redistribution layer. In particular, the interposer provides electrical interconnections between the PIC and the EIC and in addition to an underlying substrate (e.g., a PCB).

Moreover, interconnecting the electronic devices and circuits in an EIC and the optoelectronic and optical devices in a PIC may be required to achieve high performance. In order to achieve high performance interconnection between the EIC and the PIC, the electronic devices and circuits in the EIC may need to be developed by considering the design specifications of the optoelectronic and/or optical devices in the PIC or vice-versa. For example, an optical transceiver (OTRx) front-end circuitry may need to be developed to be compatible with a particular driving circuitry (e.g., in a transmitter) or a particular receiving circuitry (e.g., in a receiver) in an EIC. Accordingly, an OTRx front-end circuitry may be designed with the same foundry services and processes as the other circuitry in the EIC. In addition, GDS (Graphic Design System) layouts (e.g., Very Large Scale Integration (VLSI) and ASIC), which are industry standards for data exchange of integrated circuits, may be merged with the electronic devices and circuits in the EIC. This whole process requires time, cost and enormous efforts as different OTRx front-end circuitries may be required to be developed for different foundry services and processes in order to support various types of EICs (e.g. commercially available electronic IPs). In addition, in the 2.5D integration, the performance of the OTRx front-end circuitry may not be optimized due to the parasitic between the EIC and the PIC, which may result in bandwidth limitation.

Examples in accordance with the present subject matter described herein address the limitations of photonic transceivers, particularly, the photonics transceivers fabricated using 2.5D integration. In the examples described herein, an OTRx front-end circuitry may be integrated with a PIC. An EIC may be electrically interconnected to the OTRx front-end circuitry integrated with the PIC. This configuration may allow integration of OTRx front-end circuitries of the same design in the PICs to be interconnected to different EICs (e.g., different commercially available electronic IPs), that are fabricated with different foundry services and processes. The described configurations, thus, can simplify the overall fabrication process and, also helps in reducing or eliminating parasitic for achieving an enhanced bandwidth.

In some examples, a photonic device may include a PIC, an OTRx front-end circuitry integrated with the PIC, an EIC and an interposer. The PIC and the EIC may be disposed on the interposer. The EIC may be electrically interconnected to the OTRx front-end circuitry in the PIC. In some examples, the interposer is disposed on a substrate, and the interposer electrically interconnects the PIC and the EIC to the substrate.

The term "disposed on" may mean that an object or element is positioned, placed or deposited on or within at least a portion of another object or element. In an example, an object or element may be disposed directly on a surface or incorporated or embedded within a portion of another object or element with or without an intervening layer. The term "interconnect" or "interconnected", as used herein, is defined as connected, coupled or bonded whether directly without any intervening elements or indirectly with at least one intervening element, unless otherwise indicated. Two elements can be connected mechanically, electrically, or communicatively. In an example, the two elements are interconnected electrically unless otherwise indicated. The term "electrically interconnected" means that the two elements may be in contact with each other or electrically connected to transfer electrical signals.

Figure 1:
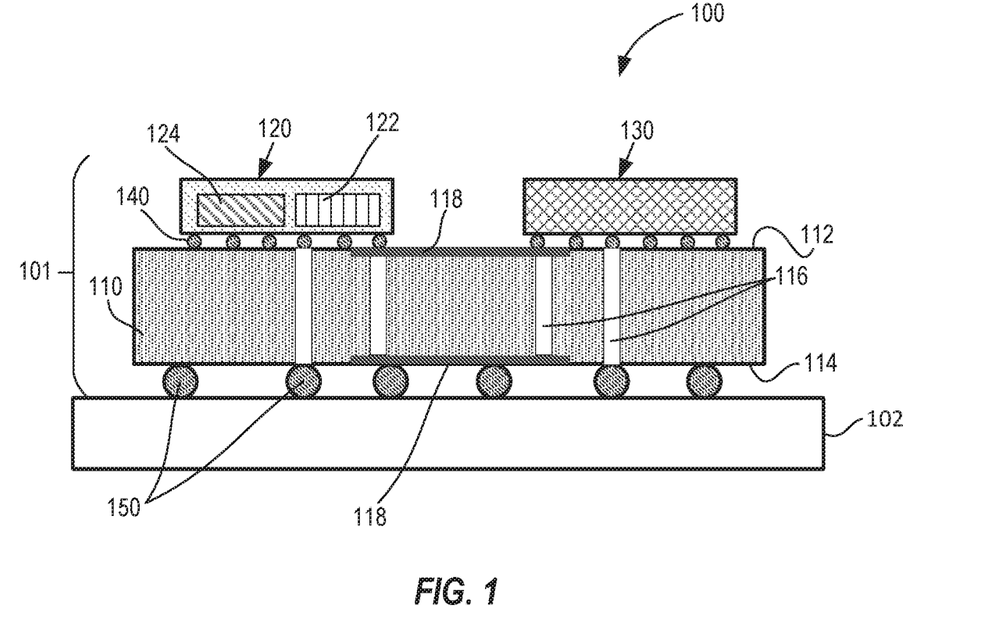
FIG. 1 is a schematic section view of a photonic device, in accordance with an example.

FIG. 1 illustrates a schematic section view of a photonic device 100 (e.g., a silicon photonic device) including an optoelectronic assembly 101 disposed on a substrate 102, according to an example of the present disclosure. The photonic device 100 may be a photonic transmitter, photonic receiver or photonic transceiver that communicates optical signals with external optical devices. The optoelectronic assembly 101 may include an interposer 110, a PIC 120, an OTRx front-end circuitry 122 integrated with the PIC 120, and an EIC 130. The integration of the OTRx front-end circuitry 122 with the PIC 120 is described in details below. The PIC 120 and the EIC 130 are disposed on the interposer 110. In this configuration, the interposer 110 is disposed on the substrate 102, and the EIC 130 and the PIC 120 are disposed on the interposer 110, as illustrated. In other words, the EIC 130 and the PIC 120 may be disposed on a first surface 112 of the interposer 110 and the substrate 102 may be disposed on a second surface 114 (opposite to the first surface 112) of the interposer 110.

The substrate 102 may be a support structure for the photonic device 100, and may comprise insulating and conductive materials for isolating as well as providing electrical interconnections for various devices and/or circuits in the PIC 120 and the EIC 130 via the interposer 110. In an example, the substrate 102 may be a packaged substrate that includes copper connections (e.g., electrical traces) or a printed circuit board (PCB).

Although a single PIC and a single EIC are shown in the examples described herein in FIG. 1, more than one EIC or more than one PIC may be disposed on the interposer in the optoelectronic assembly 101.

The interposer 110 may be a thin substrate that provides electrical redistribution for the EIC 130 and the PIC 120. In an example, the interposer 110 may enable electrical interconnections between two or more components that are included in the optoelectronic assembly 101 or connected to the optoelectronic assembly 101. The interposer 110 may be composed of silicon, glass, ceramic or an organic material, which can provide a surface or a platform for mounting the PIC 120, the EIC 130 or other components of the optoelectronic assembly 101 that connect to the EIC 130 or the PIC 120. In some examples, the interposer 110 may be a part of a wafer in which multiple interposers may be fabricated.

The interposer 110 may include vertical interconnect accesses (VIAs) 116 that provide electrical pathways between the first surface 112 and the second surface 114 of the interposer 110. The VIAs 116 may enable electrical interconnection between one or more components such as the PIC 120 and the EIC 130 disposed on the first surface 112 to one or more components such as the substrate 102 disposed on the second surface 114 or other electrical components. In an example, the interposer 110 is a silicon interposer including through-silicon-vias (TSVs).

In some examples, the interposer 110 may further include one or more redistribution layers 118 (e.g., using metal routings) to extend electrical contacts on the first surface 112 and the second surface 114 of the interposer 110 via the VIAs 116. In an example, the interposer 110 may include one or more redistribution layers on one or both the first surface 112 and the second surface 114 of the interposer 110. In an example, the redistribution layer(s) 118 may include metal traces, pads or the likes. The redistribution layer(s) 118 may provide electrical interconnections between two or more components disposed on the same surface of the interposer 110. For example, the redistribution layer(s) 118 electrically interconnects the EIC 130 and the PIC 120 on the first surface 112. In addition to the electrical redistribution, the interposer 110 may also include an optical redistribution layer such as a waveguide layer for optical redistribution.

The EIC 130 may be a chip (e.g., a CMOS or Bipolar CMOS chip). The EIC 130 processes electrical signals. These signals may include analog and digital signals that are transmitted to or received from the PIC 120, or transmitted to or received from external electrical components (not illustrated in figures) in communication with the photonic device 100. In an example, the EIC 130 may include serializer/de-serializer (SerDes), digital signal processing (DSP) or the like. In an example, the EIC 130 may include a commercially available electronic IP. In the examples described herein, the EIC 130 does not include an OTRx front-end circuitry as described in more detail below. In certain examples when the EIC 130 is employed in a photonic transmitter, the EIC 130 does not include a modulator driver. In certain examples when the EIC 130 is employed in a photonic receiver, the EIC 130 does not include a transimpedance amplifier (TIA).

The PIC 120 may be a chip (e.g., a CMOS or Bipolar CMOS chip). The PIC 120 includes one or more optoelectronic devices and one or more optical devices (collectively referred to as PIC devices 124) that process optical signals. The optoelectronic device(s) may include waveguides, modulators, photodetectors (e.g., photodiodes) or combinations thereof. The optical device(s) may include taps, terminations, grating couplers or combinations thereof. The PIC 120 may provide an optical interface to send and receive optical signals from and to the photonic device 100 to and from an external optical device such as a laser, photodiode, fiber optic cable, and the like, interconnected to the PIC 120. The PIC 120 may be interconnected to the external optical device using evanescent coupling, edge coupling, grating coupling, etc.

The OTRx front-end circuitry 122 may include electronic devices and circuits such as a transimpedance amplifier (TIA) or a modulator driver for receiving or transmitting electrical signals from or to external devices. In some examples when the optoelectronic assembly 101 is employed in a photonic receiver, the OTRx front-end circuitry 122 may include a TIA, and referred to as "receiver front-end circuitry." In other examples, when the optoelectronic assembly 101 is employed in a photonic transmitter, the OTRx front-end circuitry 122 may include a modulator driver, and referred to as "transmitter front-end circuitry."

In the examples described herein, the OTRx front-end circuitry 122 is integrated with the PIC 120. In particular, the OTRx front-end circuitry 122 is integrated with the PIC devices 124 in the PIC 120. In this regard, the OTRx front-end circuitry 122 and the PIC devices 124 are fabricated on a single chip to provide the PIC 120. In certain examples, the OTRx front-end circuitry 122 and the PIC devices 124 may be fabricated using the same fabrication process on a single chip to provide a monolithically integrated chip of the PIC 120.

In order to integrate the OTRx front-end circuitry 122 with the PIC 124, the OTRx front-end circuitry 122 may be integrated with one of the optoelectronic device(s) (e.g., a photodetector) of the PIC devices 124. In certain examples, the OTRx front-end circuitry 122 is directly connected with the optoelectronic device of the PIC devices 124. In this context, "directly connected" may mean that an OTRx front-end circuitry 122 is connected to the optoelectronic device of the PIC devices 124 without any intervening circuitry or device between the OTRx front-end circuitry 122 and the optoelectronic device of the PIC devices 124.

Further, depending on the implementation of the optoelectronic assembly 101 in a photonic receiver or a photonic transmitter, the PIC 120 includes different optoelectronic device(s) and the OTRx front-end circuitry 122 includes the receiver front-end circuitry or the transmitted front-end circuitry, respectively. For example, when the optoelectronic assembly 101 is employed in a photonic receiver, the PIC 120 includes a photodetector (e.g., a photodiode) to convert optical signals into electrical signals and the OTRx front-end circuitry 122 is the receiver front-end circuitry. The receiver front-end circuitry is integrated with the photodetector (e.g., a photodiode) in the PIC 120. During operation, the optical signals received by the photodetector in the PIC 120 may be converted to electrical signals that may be communicated to the receiver front-end circuitry in the PIC 120 for processing. The receiver front-end circuitry may then communicate the electrical signals to the EIC 130.

Figure 5A:
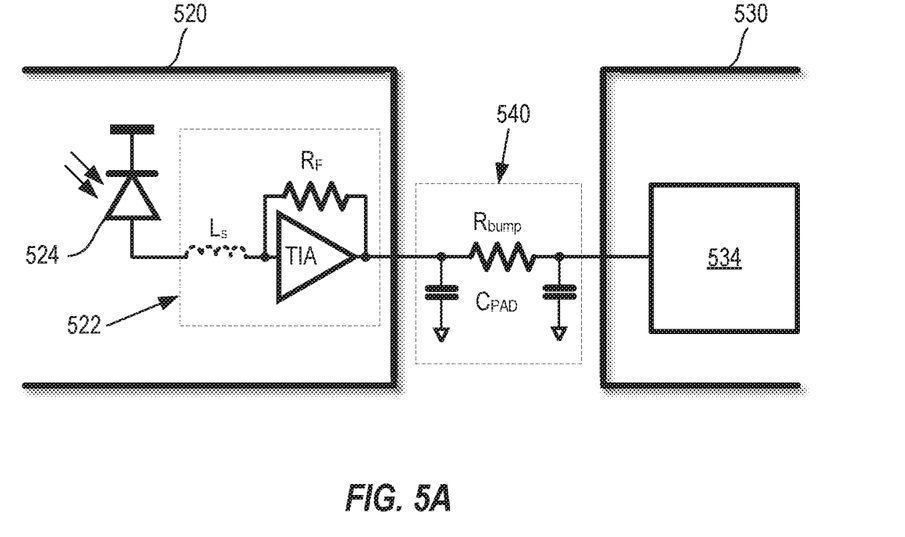
FIGS. 5A-5B schematically show electrical interconnections between an electronic integrated circuit (EIC) and a photonic integrated circuit (PIC) employed in each of an example photonic receiver and a comparative photonic receiver.

FIG. 5A shows an example PIC 520 that includes a receiver front-end circuitry 522 integrated with a photodiode 524. In the illustrated example, the receiver front-end circuitry 522 includes a TIA that is directly connected to the photodiode 524 in the PIC 520. In an example, the receiver front-end circuitry 522 may further include a passive inductor (Ls) connected between the TIA and the photodiode 524. The passive inductor helps in achieving a broadband response at the TIA.

Figure 7A:
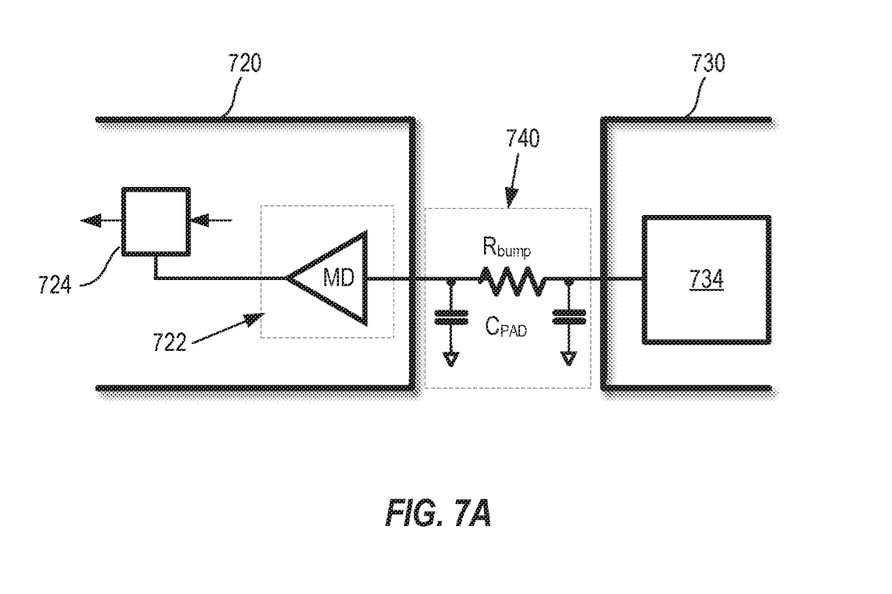
FIGS. 7A-7B schematically show electrical interconnections between an EIC and a PIC employed in each of an example photonic transmitter and a comparative photonic transmitter.

In examples when the optoelectronic assembly 101 is employed in a photonic transmitter, the PIC 120 includes an optical modulator to convert electrical signals into optical signals and the OTRx front-end circuitry 122 is the transmitter front-end circuitry. The transmitter front-end circuitry is integrated with the optical modulator in the PIC 120. During operation, the EIC 130 may communicate electrical signals to the transmitter front-end circuitry in the PIC 120. The electrical signals may then be communicated to the optical modulator in the PIC 120, which converts the electrical signals to optical signals. FIG. 7A shows an example PIC 720 that includes a transmitter front-end circuitry 722 integrated with an optical modulator 724. In the illustrated example, the transmitter front-end circuitry 722 includes a modulator driver (MD) that is directly connected to the optical modulator 724 in the PIC 720.

As illustrated in FIG. 1, the PIC 120 is disposed on a portion of the first surface 112 of the interposer 110 and the EIC 130 is disposed on another portion of the first surface 112 of the interposer 110. In an example, a flip-chip bonding technique may be used for electrically interconnecting the EIC 130 and the PIC 120 on the first surface 112 of the interposer 110. As illustrated, the PIC 120 and the EIC 130 may be electrically interconnected to the interposer 110 using solder bumps 140 (e.g., microbumps). As used herein, the term "solder bumps" refer to small spheres of solder that are formed on one component to connect to contact areas on another component to form electrical interconnections. As such, the solder bumps 140 may be small spheres of solder that extend from the PIC 120 and the EIC 130 to connect to contact areas (e.g., the redistribution layer(s) 118) on the interposer 110. In some other examples, the solder bumps 140 may be small spheres of solder that extend from the interposer 110 to connect to contact areas or metal pads on the PIC 120 and the EIC 130.

As noted, the EIC 130 is electrically interconnected to the OTRx front-end circuitry 122 in the PIC 120. In an example, the interposer 110 may enable the electrical connectivity between the EIC 130 and the OTRx front-end circuitry 122 in the PIC 120 by providing electrical interconnections. In an example, the EIC 130 is electrically interconnected to the OTRx front-end circuitry 122 via the redistribution layer(s) 118 of the interposer 110.

In an example, the optoelectronic assembly 101 may further include external connections such as solder bumps 150 (e.g., C4 bumps) that may enable the optoelectronic assembly 101 to mount and connect to other electrical components such as the substrate 102. The solder bumps 150 may be provided on the second surface 114 of the interposer 110 via the redistribution layer(s) 118 fabricated on the second surface 114. In an example, the interposer 110 may be electrically interconnected to the substrate 102 via the solder bumps 150. In an example, one or both of the PIC 120 and the EIC 130 are electrically connected with the substrate 102 via the solder bumps 150, redistribution layers (e.g., the redistribution layer(s) 118) or VIAs 116 provided in the interposer 110.

Figure 2:
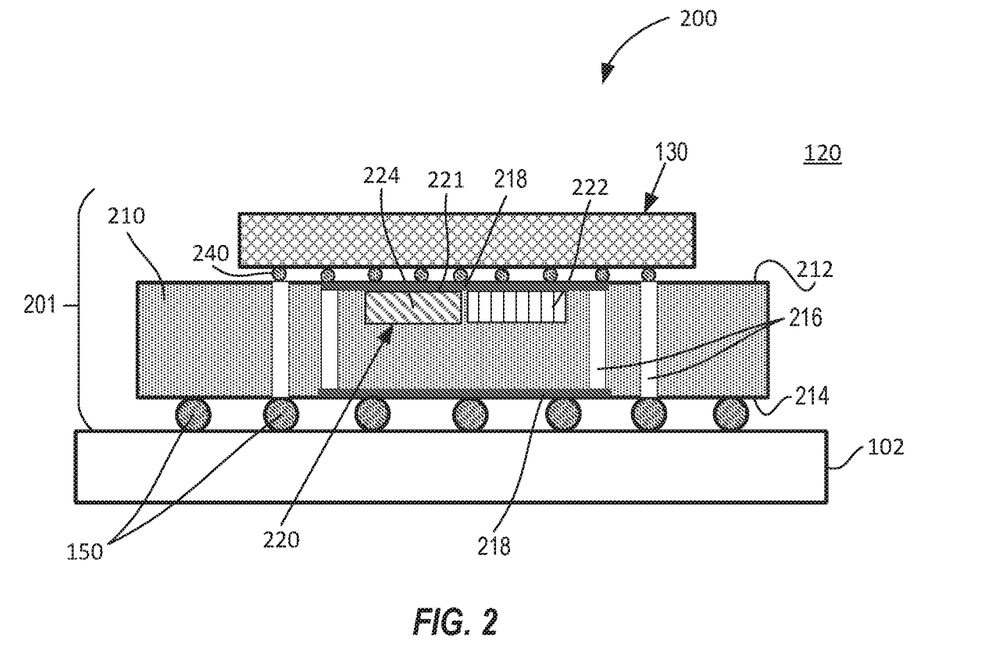
FIG. 2 is a schematic section view of a photonic device, in accordance with another example

FIG. 2 illustrates a schematic section view of another example photonic device 200. The photonic device 200 may include certain elements similar to those described in FIG. 1 which are marked with similar reference numerals, description of which are not repeated herein. In comparison to FIG. 1, the photonic device 200 may include an optoelectronic assembly 201 disposed on the substrate 102. The optoelectronic assembly 201 may comprise a different configuration as compared to the optoelectronic assembly 101 of FIG. 1. In the optoelectronic assembly 201, a PIC 220 may be embedded within a portion of an interposer 210 having a first surface 212 and a second surface 214. An OTRx front-end circuitry 222 (similar to the OTRx front-end circuitry 122 of FIG. 1) is integrated with the PIC 220. In particular, the OTRx front-end circuitry 222 is integrated with the PIC devices 224 (similar to the PIC devices 124 of FIG. 1) of the PIC 220. In some examples, the PIC 220 and the OTRx front-end circuitry 222 are integrated with the interposer 210. In an example, a technique of fabricating an active photonic interposer may be used for integrating the PIC 220 with the interposer 210. Generally, in this technique, the optoelectronic and optical devices of a PIC are fabricated along with the fabrication of an interposer (e.g., a silicon interposer) using the same fabrication process. Such fabrication process may allow the interposer and the PIC to integrate together, and such interposer may be referred to as an active photonic interposer. Electrical interconnections between the interposer and the PIC may be established using the redistribution layers during the fabrication process. This technique of fabricating an active photonic interposer may allow the electrical as well as optical redistribution of the interposer to combine with the functionalities of the PIC, and provide a compact and less expensive active photonic interposer. In the examples described herein, the PIC devices 224 (e.g., including the optoelectronic device(s) and the optical device(s)) and the OTRx front end circuitry 222 may be fabricated along with the fabrication of the interposer 210 using the same fabrication process. In these examples, the interposer 210 may be an active photonic interposer that includes the OTRx front-end circuitry 222 monolithically integrated with the PIC 220. Further, the interposer 210 may include VIAs 216 (similar to VIA(s) 116) and one or more redistribution layers 218 (similar to the redistribution layer(s) 118) to enable electrical interconnections between two or more components disposed on the same surface or different surfaces of the interposer 210.

As illustrated in FIG. 2, the PIC 220 may be integrated with the interposer 210 such that a surface 221 of the PIC 220 is exposed from the interposer 210. In an example, the surface 221 of the PIC 220 may include the redistribution layer(s) 218 to connect to the solder bumps 240 (similar to the solder bumps 140). The exposed surface 221 of the PIC 120 may allow for electrical connectivity with external electrical devices, external optical devices and other optical or electrical connections. In this configuration, the EIC 130 may be disposed on the surface 221 of the PIC 120 using the flip-chip bonding technique. The EIC 130 may be electrically interconnected to the PIC 220 via the solder bumps 240. In an example, the solder bumps 240 may be small spheres of solder that extend from the EIC 130 to connect with the redistribution layer(s) 218 on the PIC 220. In other examples, the solder bumps 240 may be small spheres of solder that extend from the PIC 220 to connect with contact areas or metal pads on the EIC 130. In a similar fashion as described in FIG. 1, the EIC 130 is electrically interconnected to the OTRx front-end circuitry 222 in the PIC 220 (e.g., as shown in FIG. 5A or 7A).

Figure 3:
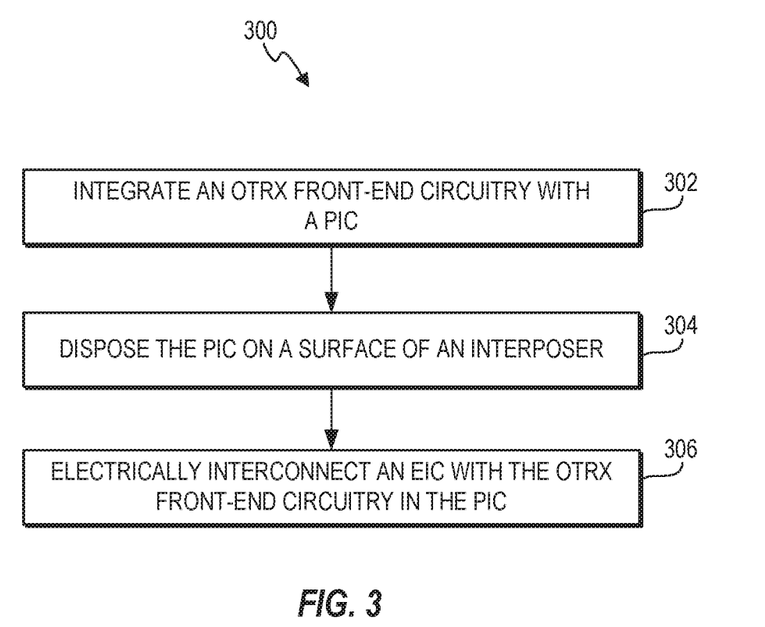
FIG. 3 is a flowchart of a method of fabricating a photonic device, in accordance with an example.

FIG. 3 is a flowchart of an example method 300 for fabricating a photonic device (e.g., the photonic device 100 of FIG. 1). For ease of illustration, the example method 300 is described in details below with reference to FIG. 1.

At block 302, the method 300 includes integrating the OTRx front-end circuitry 122 with the PIC devices 124 in the PIC 120. In an example, the OTRx front-end circuitry 122 and the PIC devices 124 are fabricated using the same fabrication process on a single chip to provide a monolithically integrated chip of the PIC 120.

In some examples when the PIC 120 includes a photodetector (e.g., a photodiode), the OTRx front-end circuitry 122 that includes a TIA is integrated with the photodetector (as shown in FIG. 5A). In certain examples, the TIA is directly connected to the photodetector. In some examples when the PIC 120 includes an optical modulator, the OTRx front-end circuitry 122 that includes a modulator driver is integrated with the optical modulator (as shown in FIG. 7A). In certain examples, the modulator driver is directly connected to the optical modulator.

At block 304, the method 300 includes disposing the PIC 120 on the interposer 110 (FIG. 1). As illustrated in FIG. 1, the PIC 120 is disposed on a portion of the first surface 112 of the interposer 110 using for example, a flip-chip bonding technique.

At block 306, the method 300 includes electrically interconnecting the EIC 130 with the OTRx front-end circuitry 122 in the PIC 120. In an example, the EIC 130 may be simultaneously or sequentially disposed on another portion of the first surface 112. The EIC 130 may be disposed using the flip-chip bonding technique. In these examples, the EIC 130 is electrically interconnected with the OTRx front-end circuitry 122 via solder bumps 140 and the redistribution layer(s) 118.

In some examples, the method 300 may further include providing external connections such as solder bumps 150 on the second surface 114 of the interposer 110. Once the above described method blocks are performed, the optoelectronic assembly 101 is formed. The method 300 may further include disposing the optoelectronic assembly 101 on the substrate 102 and electrically interconnecting both the EIC 130 and the PIC 120 with the substrate 102 via the solder bumps 150.

Figure 4:
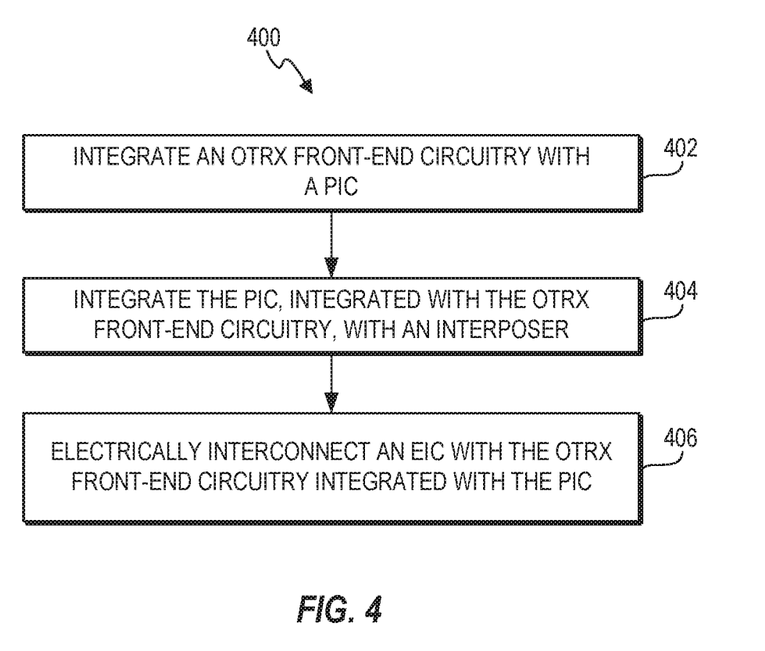
FIG. 4 is a flowchart of a method of fabricating a photonic device, in accordance with another example.

FIG. 4 is a flowchart of an example method 400 for fabricating a photonic device (e.g., the photonic device 200 of FIG. 2). For ease of illustration, the example method 400 is described in details below with reference to FIG. 2.

At block 402, the method 400 includes integrating the OTRx front-end circuitry 222 with the PIC devices 224 of the PIC 220. At block 404, the method includes integrating the PIC 220 with the interposer 210. In the examples as illustrated in FIG. 2, the OTRx front-end circuitry 222 and the PIC devices 224 are fabricated with the fabrication of the interposer 210 using the technique for fabricating an active photonic interposer. The details of fabricating an active photonic interposer are described previously. During the fabrication, the OTRx front-end circuitry 222 is integrated with the PIC devices 224. Further, the redistribution layer(s) 218 may be disposed on the exposed surface 221 of the PIC 220 that is integrated with the OTRx front-end circuitry 222, during the fabrication. That is, the method blocks 402 and 404 are performed simultaneously.

In some examples when the PIC devices 224 includes a photodetector (e.g., a photodiode), the OTRx front-end circuitry 222 that includes a TIA is integrated with the photodetector (as shown in FIG. 5A). In certain examples, the TIA is directly connected to the photodetector. In some examples when the PIC devices 224 includes an optical modulator, the OTRx front-end circuitry 222 that includes a modulator driver is integrated with the optical modulator (as shown in FIG. 7A). In certain examples, the modulator driver is directly connected to the optical modulator.

At block 406, the method 400 includes electrically interconnecting the EIC 130 with the OTRx front-end circuitry 222. In these examples, the EIC 130 is disposed on the exposed surface 221 of the PIC 220 using the flip-chip bonding technique and electrically interconnected with the OTRx front-end circuitry 222 via the solder bumps 240 and the redistribution layer(s) 218.

In some examples, the method 400 may further include providing external connections such as solder bumps 150 on the second surface 214 of the interposer 210. Once the above described method blocks are performed, the optoelectronic assembly 201 is formed. The method 300 may further include disposing the optoelectronic assembly 201 on the substrate 102 and electrically interconnecting both the EIC 130 and the PIC 220 with the substrate 102 via the solder bumps 150.

EXAMPLES

The examples that follow are merely illustrative, and should not be construed to be any sort of limitation on the scope of the claimed invention.

Example A: Two photonic receivers: an example photonic receiver (Example 1) and a comparative photonic receiver (Example 2) are implemented. Each of the example and comparative photonic receivers includes a PIC and an EIC disposed on a silicon photonic interposer in a configuration similar to as shown in FIG. 2 and fabricated as described in FIG. 4.

Figure 5B:
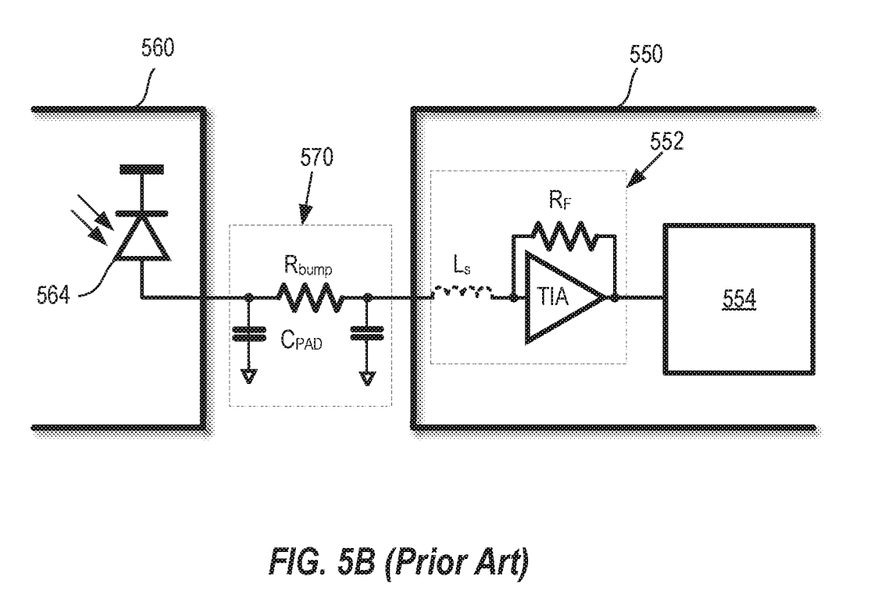

FIG. 5A schematically shows electrical connections between the components/devices of an EIC 530 and a PIC 520 in the example photonic receiver of Example 1. In Example 1, a receiver front-end circuitry 522 including a TIA and Ls is integrated with a photodiode 524 in the PIC 520. A SerDes 534 in the EIC 530 is interconnected to the receiver front-end circuitry 522 in the PIC 520 via electrical contacts 540 (including solder bumps and metal pads). The electrical contacts 540 may provide parasitic capacitance ($C_{PAD}$) due to the metal pads and bump resistance ($R_{bump}$) due to the solder bumps. FIG. 5B schematically shows electrical connections between the components/devices of an EIC 550 and a PIC 560 in Example 2. In contrast to Example 1, in Example 2, a receiver front-end circuitry 552 (similar to the receiver front-end circuitry 522) is integrated with a SerDes 554 (similar to the SerDes 534) in the EIC 550. The receiver front-end circuitry 552 is interconnected to a photodiode 564 (similar to the photodiode 524) in the PIC 560 via electrical contacts 570 (similar to the electrical contacts 540).

Figure 6A:
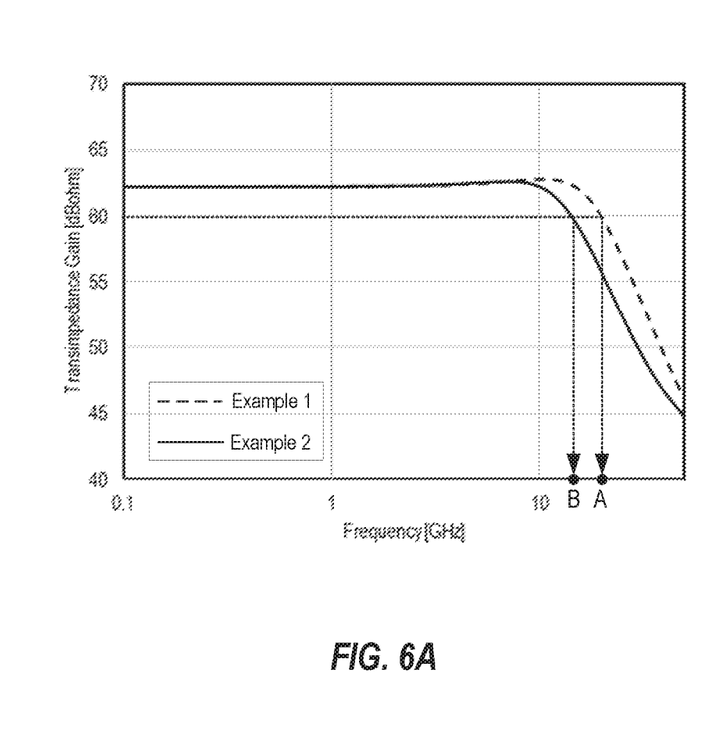
FIGS. 6A-6B show comparative simulation results of transimpedance gain and 3 dB Bandwidth for the example photonic receiver and the comparative photonic receiver of FIGS. 5A-5B.
Figure 6B:
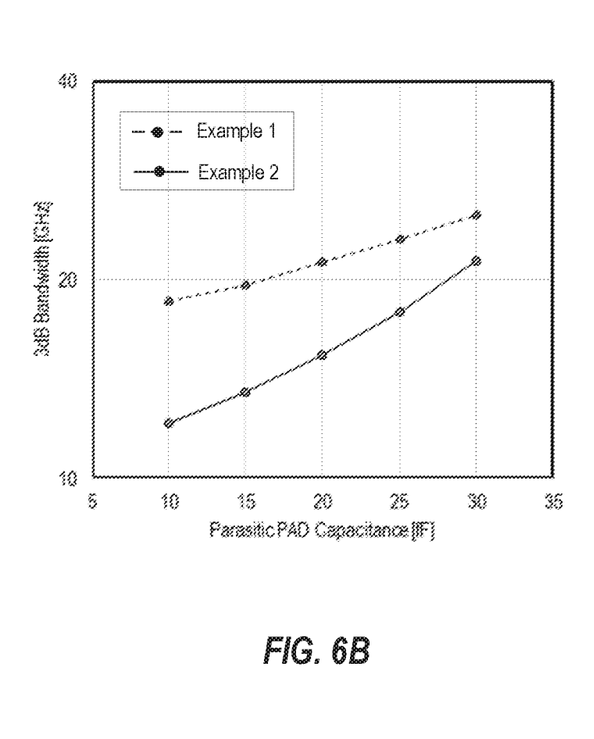

FIG. 6A shows transfer functions (transimpedance gain vs. frequency) for the example photonic receiver of Example 1 and the comparative photonic receiver of Example 2, respectively, based on simulation results. From the transfer functions, in FIG. 6A, 3-dB bandwidths for the example photonic receiver of Example 1 and the comparative photonic receiver of Example 2 are obtained. 3-dB bandwidth is a frequency at which the transimpedence gain decreases by 3 dB from its maximum value. 3-dB bandwidth of a photonic device is a measure of a speed of sending and receiving a data stream to and from the photonic device. For example, if 3-dB bandwidth for a photonic device is 10 GHz, it can receive a data stream with a speed of up to 20 Gb/s. In FIG. 6A, the 3-dB bandwidth of the example photonic receiver of Example 1 is denoted by 'A' and the 3-dB bandwidth of the comparative photonic receiver of Example 2 is denoted by 'B.' As clearly seen from FIG. 6A, the 3-dB bandwidth ('A') of the example photonic receiver in Example 1 is improved by about 38% from the 3-dB bandwidth ('B') of the comparative photonic receiver in Example 2 with the same transimpedance gain. The 3-dB bandwidth in Example 1 is more as compared to that of Example 2 because TIA in Example 1 provides larger currents to drive parasitic capacitance ($C_{PAD}$) and bump resistance ($R_{bump}$) between the receiver front-end circuitry 522 and the EIC 530 as compared to the current provided to $C_{PAD}$ and $R_{bump}$ between the photodiode 564 and the receiver front-end circuitry 552 in the EIC 550 in Example 2. Further, FIG. 6B shows variations of 3-dB bandwidths in Example 1 and Example 2 with variations of $C_{PAD}$. It can be clearly seen that the variations in 3-dB bandwidths in Example 1 can be reduced by about 40% by employing the receiver front-end circuitry 522 in the PIC 520 as compared to that of Example 2.

Example B: Two photonic transmitters: an example photonic transmitter (Example 3) and a comparative photonic transmitter (Example 4) are implemented. Each of the example and the comparative photonic transmitters includes a PIC and an EIC disposed on an interposer in a configuration similar to as shown in FIG. 2 and fabricated as described in FIG. 4.

Figure 7B:
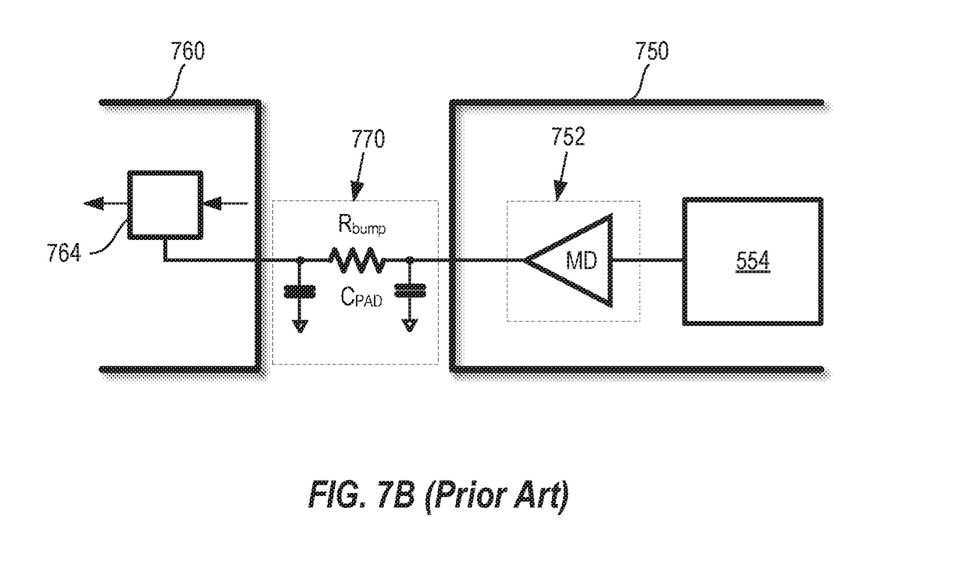

FIG. 7A schematically shows electrical connections between the components/devices of an EIC 730 and a PIC 720 in Example 3. In Example 3, a transmitter front-end circuitry 722 including a modulator driver (MD) is monolithically integrated with an optical modulator 724 in the PIC 720. A SerDes 734 in the EIC 730 is electrically interconnected to the MD of the transmitter front-end circuitry 722 in the PIC 720 via electrical contacts 740 (including solder bumps and metal pads). The electrical contacts 740 may provide parasitic capacitance ($C_{PAD}$) due to the metal pads and bump resistance ($R_{bump}$) due to the solder bumps. FIG. 7B schematically shows electrical connections between the components/devices of an EIC 750 and a PIC 760 in Example 4. In contrast to Example 3, in Example 4, a transmitter front-end circuitry 752 (similar to the transmitter front-end circuitry 722) is integrated with a SerDes 754 (similar to the SerDes 734) in the EIC 750. The transmitter front-end circuitry 752 is electrically interconnected to an optical modulator 764 (similar to the optical modulator 724) in the PIC 760 via electrical contacts 770 (similar to the electrical contacts 740).

As known to those skilled in the art, in order to enhance an extinction ratio of an optical modulator in a photonic transmitter (e.g., similar to as described in Examples 3 and 4), a transmitter front-end circuitry (e.g., similar to 722 and 752 as described in Examples 3 and 4) needs to have a large driving voltage capability, for example, 5 V for MZI modulator and ~2.5 V for a ring modulator. In Example 4, the modulator driver in the transmitter front-end circuitry 752 cannot generate large output swing because of the supply voltage limit and reliability issues in developing the EIC 750 (e.g., using advanced CMOS technology to minimize the power consumption). In contrast, in Example 3, by employing the transmitter front-end circuitry 722 in the PIC 720 and using CMOS technologies that support high voltage requirements, an extinction ratio of the optical modulator 724 can be improved, which thereby can improve overall performance of the example optical transmitter.

It should be understood that the above-described examples are merely illustrative of some of the many specific examples that represent the principles described herein. Clearly, those skilled in the art can readily devise numerous other arrangements without departing from the scope as defined by the following claims.

The invention claimed is:

1. An photonic device, comprising:
a photonic integrated circuit (PIC),
an optical transceiver (OTRx) front-end circuitry integrated with the PIC;
an electronic integrated circuit (EIC); and
an interposer, wherein the PIC and the EIC are disposed on the interposer; and
wherein the EIC is electrically interconnected to the OTRx front-end circuitry in the PIC and wherein the PIC is embedded in a portion of the interposer such that a surface of the PIC is exposed and the EIC is electrically interconnected to the OTRx front-end circuitry in the PIC through the exposed surface of the PIC.

2. The photonic device of claim 1, wherein the PIC comprises an optoelectronic device and the OTRx front-end circuitry is connected to the optoelectronic device.

3. The photonic device of claim 1, wherein the OTRx front-end circuitry comprises a transimpedance amplifier.

4. The photonic device of claim 3, wherein the PIC comprises a photodetector and the transimpedance amplifier is connected to the photodetector.

5. The photonic device of claim 1, wherein the OTRx front-end circuitry comprises a modulator driver.

6. The photonic device of claim 5, wherein the PIC comprises an optical modulator and the modulator driver is connected to the optical modulator.

7. The photonic device of claim 1, wherein the PIC and the EIC are positioned on a surface of the interposer and the EIC is electrically interconnected to the OTRx front-end circuitry in the PIC through the interposer.

8. The photonic device of claim 1, wherein the EIC is disposed on a portion of the exposed surface of the PIC.

9. The photonic device of claim 1, wherein the interposer is a silicon interposer.

10. A photonic device, comprising:
an interposer disposed on a substrate;
a photonic integrated circuit (PIC);
an optical transceiver (OTRx) front-end circuitry integrated with the PIC; and
an electronic integrated circuit (EIC), wherein the PIC and the EIC are disposed on the interposer and the EIC is electrically interconnected to the OTRx front-end circuitry in the PIC and wherein the PIC is embedded in a portion of the interposer such that a surface of the PIC is exposed from the interposer and the EIC is electrically interconnected to the OTRx front-end circuitry in the PIC through the exposed surface of the PIC.

11. The photonic device of claim 10, wherein the OTRx front-end circuitry comprises a transimpedance amplifier.

12. The photonic device of claim 11, wherein the PIC comprises a photodetector and the transimpedance amplifier is connected to the photodetector.

13. The photonic device of claim 10, wherein the OTRx front-end circuitry comprises a modulator driver.

14. The photonic device of claim 13, wherein the PIC comprises an optical modulator and the modulator driver is connected to the optical modulator.

15. The photonic device of claim 10, wherein the PIC and the EIC are positioned on a surface of the interposer and the EIC is electrically interconnected to the OTRx front-end circuitry in the PIC through the interposer.

16. A method of fabricating a photonic device: comprising:
integrating an OTRx front-end circuitry with a photonic integrated circuit (PIC);
disposing the PIC on an interposer, wherein the PIC is embedded in a portion of the interposer such that a surface of the PIC is exposed from the interposer;
electrically interconnecting an EIC with the OTRx front-end circuitry in the PIC through the exposed surface of the PIC.

17. The method of claim 16, wherein the PIC comprises a photodetector and the OTRx front-end circuitry comprises a transimpedance amplifier, and the method comprises:
integrating the transimpedance amplifier with the photodetector.

18. The method of claim 16, wherein the PIC comprises an optical modulator and the OTRx front-end circuitry comprises a modulator driver, and the method comprises:
integrating the modulator driver with the optical modulator.

* * * * *